United States Patent [19]

Lindner

[11] Patent Number: 4,928,627
[45] Date of Patent: May 29, 1990

[54] APPARATUS FOR COATING A SUBSTRATE

[75] Inventor: Georg H. Lindner, Haydnlaan, Netherlands

[73] Assignee: Atochem North America, Inc., Somerville, N.J.

[21] Appl. No.: 71,501

[22] Filed: Jul. 9, 1987

Related U.S. Application Data

[63] Continuation-in-part of Ser. No. 812,873, Dec. 23, 1985, abandoned.

[51] Int. Cl.⁵ .................. B05B 15/12; B05B 15/08
[52] U.S. Cl. .................. 118/718; 118/314;
118/326; 65/60.5; 65/60.51; 65/60.52; 65/60.2;
427/255.5; 427/166; 427/424
[58] Field of Search ............. 118/314, 326, 718;
65/60.5, 60.51, 60.52, 60.2, 60.3; 427/255.5,
166, 424

[56] References Cited

U.S. PATENT DOCUMENTS 3,293,074 12/1966 Nickl .................. 118/725
3,876,410 4/1975 Scholes .................. 427/255 X
4,351,267 9/1982 Kalbskopf et al. .................. 118/718
4,574,733 3/1986 Nath et al. .................. 118/718
4,584,206 4/1986 Sleighter .................. 427/166
4,612,217 9/1986 Gordon .................. 427/166 X Primary Examiner—Shrive Beck
Attorney, Agent, or Firm—S. A. Marcus; R. B. Henn

[57] ABSTRACT

A coating applicator is provided for depositing a film on a surface of glass and other substrates by chemical vapor deposition. The applicator includes a pair of opposing coating nozzles for applying a vaporized coating chemical reactant in a carrier gas to the surface at such a concentration and velocity that coating of the surface is achieved under substantially reaction rate controlled conditions. Each coating nozzle is positioned adjacent the surface with a small clearance therebetween which is open to the outside atmosphere. The opposing coating nozzles are directed toward each other at a selected angle with respect to a normal to the surface of the substrate. The angle and the clearance provides a condition where there is substantially no intermixing of coating vapors with the outside atmosphere.

21 Claims, 12 Drawing Sheets

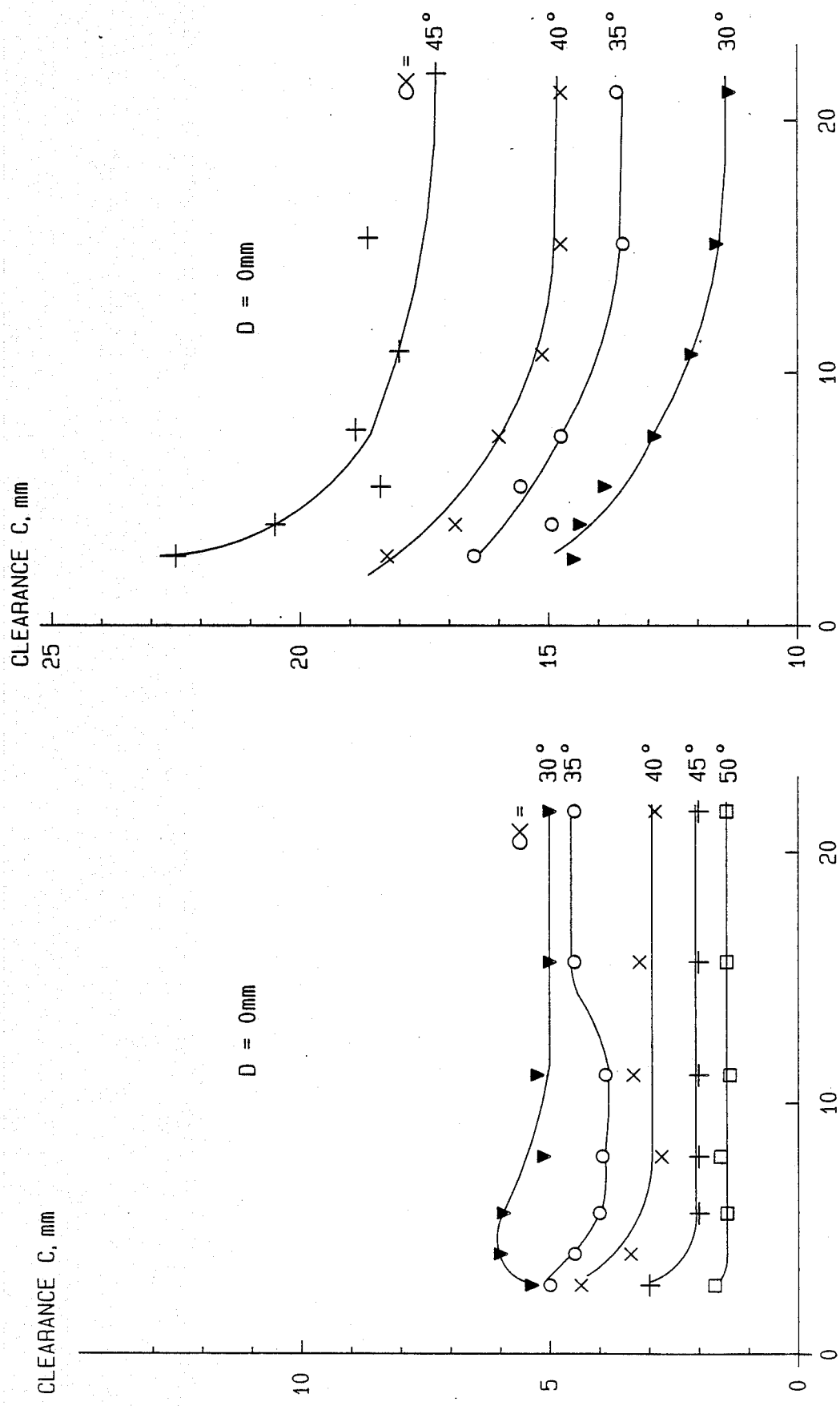

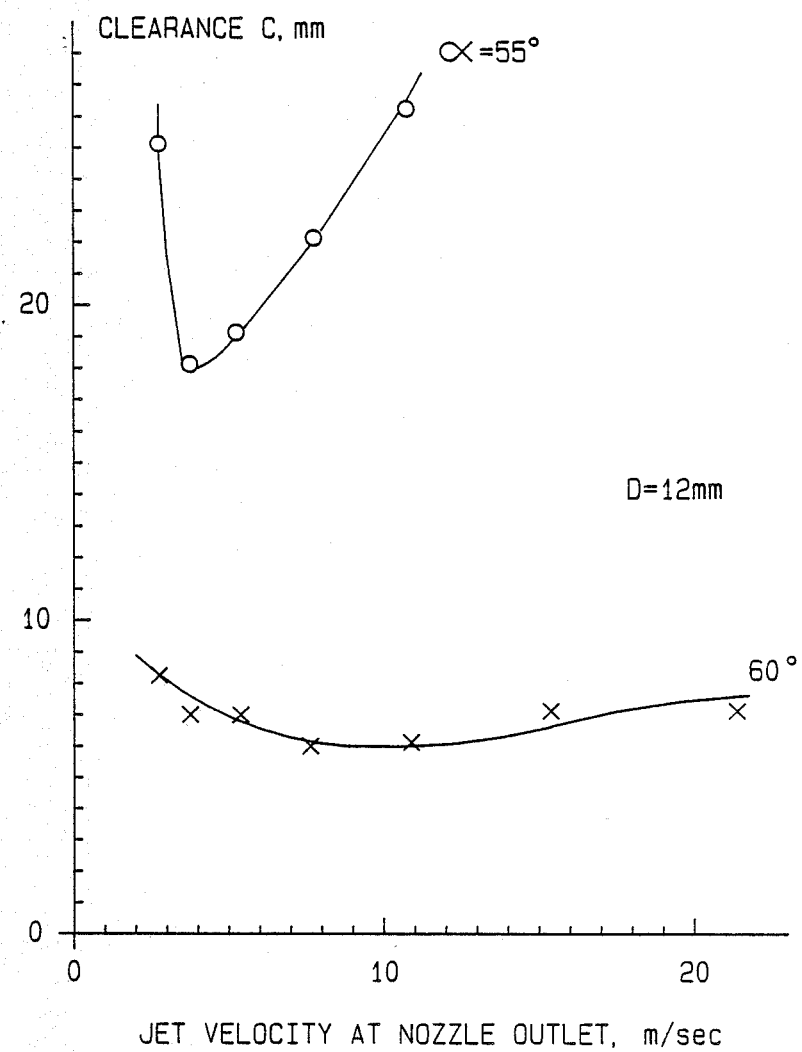
F I G. 8

APPARATUS FOR COATING A SUBSTRATE

CROSS-REFERENCE TO A RELATED APPLICATION

This application is a continuation-in-part of copending U.S. Pat. application Ser. No. 812,873, filed December 23, 1985, entitled "Apparatus for Coating a Flat Glass Substrate", by the same inventor, and assigned to the same assignee, as herein and now abandoned. The entire disclosure of this prior application is incorporated by reference herein.

BACKGROUND OF THE INVENTION

1. Field of the Invention

This invention relates to apparatus for chemical vapor deposition (CVD) of coatings onto substrates such as flat glass substrates, and, more particularly, to apparatus suitable for forming metal-containing and like films having advantageous properties in an efficient and economical manner.

2. Description of the Prior Art

The desirability of applying uniform coatings to a flat glass substrate for the purpose of varying its thermal, optical and/or electrical properties has long been recognized. Such coatings generally consist of a metal or metal oxide, particularly tin oxide. In such process, a hot, freshly formed glass ribbon travels from a flat glass forming section to an annealing section, where the coating is deposited on one face thereof. The coating applicator generally consists of one or more nozzles which direct a spray of coating chemical reactant in a carrier gas onto the exposed face of the glass ribbon. Then reaction by-products and unused coating compound are removed by an exhaust duct.

Conventional coating apparatus, systems and processes are disclosed in such U.S. Pat. Nos. as 3,674,453; 3,681,042; 3,689,304; 3,841,858; 3,850,679; 3,852,098; 3,876,410; 3,888,649; 3,964,432; 3,974,432; 4,123,244; 4,125,391; 4,130,673; 4,144,362; 4,188,199; 4,206,252; 4,293,173; 4,293,326; 4,294,594; 4,325,987; 4,329,379; 4,330,318; 4,349,372; 4,387,134; 4,397,259; 4,469,045; 4,476,158; 4,500,567; 4,536,204; 4,584,206; 4,585,674; 4,597,984; 4,598,023; and 4,601,917; in EPO No. 0188962; an article entitled "Production of Chemical Vapor Deposition Coatings" by Nicholas M. Gralenshi, Watkins-Johnson Co., Scotts Valley, California 95066, pages 102–144; and an article entitled "Coating of Glass by Chemical Vapor Deposition" by John M. Blocher, Jr. in Thin Solid Films, No. 77, pages 51–63 (1981); the entire disclosures of which are incorporated by reference herein.

In the CVD process, it is desired to apply coatings to flat glass substrates which are (1) uniform, (2) haze-free, (3) have a low electrical resistivity; and which are formed during (4) a relatively short deposition time. Although each of these requirements can be met individually, it is exceedingly difficult to satisfy all of them at the same time. For example, high substrate temperatures will provide short deposition times. With coating chemicals containing a dopant precursor, high substrate temperatures result in films having lower electrical resistance. Moreover, high deposition temperatures favor increased haze in the coatings formed. Similarly, haze-free films can be achieved using a low surface temperature, and relatively low water vapor content in the coating gases, albeit at the expense of reduced deposition rate and poorer electrical properties.

Uniform coatings also require the application of a substantially uniform coating chemical composition at uniform vapor velocities on each spot on the surface of the glass substrate, which is difficult to achieve with known nozzle applications. In short, conventional CVD systems are found to be deficient with respect to one or more of these film qualities and process parameters.

Furthermore, with prior art systems, a larger exhaust for removing spent gases is generally required. Such large exhausts tend to draw outside gases, e.g. air, into the coating zone, which dilutes the concentration of coating vapors. On the other hand, a small exhaust system will allow coating gases to escape from the coating zone and become admixed with the outside atmosphere. In both cases, the diluted vapors which contact the glass substrate produce unacceptably hazy films. Moreover, large amounts of exhaust reduce the efficiency of use of coating material, and increase the cost of recovery of coating material from the exhaust gases.

Many of these prior CVD systems use a nozzle or nozzles which are positioned adjacent to the surface of the substrate, and which are provided with clearances between the nozzle and substrate and between the exhaust port and substrate. These open systems result in outside air being attracted to and mixed with coating vapors causing haze, for example, as shown in U.S. Pat. No. 4,123,244.

Further, with conventional CVD systems, the assumed relationships between coating gas velocity, chemical concentration and chemical consumption, with nozzle slit width, have provided less than satisfactory coating applicators. Specifically, such relationships have required a nozzle applicator with a rather narrow nozzle slit width, which causes extreme problems with film uniformity and nozzle clogging. In addition, such systems consume a large amount of chemical reactant, resulting in an uneconomical process. On the other hand, systems which use a low gas velocity or low chemical concentration tend to effect deposition at a rate which is controlled primarily by diffusion of chemicals to and from the substrate surface, which can produce a coating which has a rough surface and hazy characteristic.

Accordingly, it is an object of the present invention to provide an improved CVD process, apparatus and system for depositing advantageous films on a flat glass substrate.

Another object of this invention is to deposit a uniform, haze-free, low electrical resistivity film on a flat glass substrate at a high deposition rate by a CVD process.

Still another object herein is to provide a coating applicator which applies a high concentration of coating chemical at relatively high jet speeds to a flat glass substrate.

It is a further object of the present invention to provide a process of coating a flat glass substrate by CVD with little cooling of the substrate.

It is still another object of this invention to provide a process and apparatus for coating a flat glass substrate with little or no intermixing of the vaporized chemical and carrier gas with outside air.

A feature of the invention is the provision of an improved CVD process, apparatus and system for chemical vapor deposition of a visibly reflective or infrared reflective film onto a moving float glass ribbon under reaction rate controlled conditions with substantially no intermixing of coating chemical vapors with the outside atmosphere.

These and other objects, features and advantages of the present invention will become readily apparent from the following detailed description thereof which is to be read in connection with the accompanying drawings, in which:

BRIEF DESCRIPTION OF THE DRAWINGS

FIG. 6 is a graphical diagram similar to FIG. 4 for the nozzle apparatus of FIG. 5 in which D=0, illustrating a condition for substantially zero air intermixing.

FIG. 7 is a graphical diagram similar to FIG. 6, showing a second condition for substantially zero air intermixing, at larger values of clearance C.

FIG. 8 is a graphical diagram similar to FIG. 6 for D=12 mm.

SUMMARY OF THE INVENTION

The present invention provides a coating applicator system and deposition method for chemical vapor deposition of a metal-containing film on a surface of a substrate, particularly a flat glass substrate, such as a moving float glass ribbon. The coating applicator of the invention includes nozzle means for applying a vaporized coating chemical in a carrier gas to such substrate at a high jet velocity and high chemical concentration such that deposition is carried out under substantially reaction rate controlled conditions. The nozzle means include a pair of opposing nozzles positioned adjacent the surface of the substrate, each being directed toward each other at a selected angle to the normal to said surface with a clearance therebetween which is open to the outside atmosphere, such that there is substantially no intermixing of coating gases with the outside atmosphere. The apparatus further includes supply means for supplying one or more vaporized coating chemical or chemicals and carrier gas to the nozzle means, as the same or separate chemicals in each nozzle, and exhaust means for removing exhaust material. The system preferably includes recirculation means to circulate the gases within the system over the nozzle means to facilitate operation at the desired high gas velocities and high chemical concentrations.

Reaction rate controlled conditions are achieved at high substrate temperatures under relatively high velocities and high coating chemical concentrations. Under such reaction rate controlled conditions, small variations in jet velocities or chemical concentration have little or no influence on deposition rate. This process is decidedly advantageous over diffusion rate controlled processes, where the reaction rate is approximately proportional to the chemical concentration, and highly influenced by the gas velocity, which are difficult parameters to control. Of course, in this invention, under reaction rate controlled conditions, the deposition rate is affected by changes in deposition temperature, and, accordingly, the surface temperatures must be kept substantially the same on each spot on the surface of the substrate to avoid variations in film thickness across the film surface.

Usually, in a CVD process on glass, the surface of the glass is kept at a substantially constant temperature between about 550° and 700° C. At these temperatures, it is possible herein to deposit a uniform, electrically conducting film without haze at a deposition rate of more than 1000 A/sec. Such films are made using high jet velocities and high chemical concentrations with substantially no intermixing of coating chemical with outside air.

As will be described in detail hereinafter, the apparatus of the present invention permits the use of such desired high velocities and high chemical concentrations in an efficient CVD process under reaction rate controlled conditions.

Figure 1:
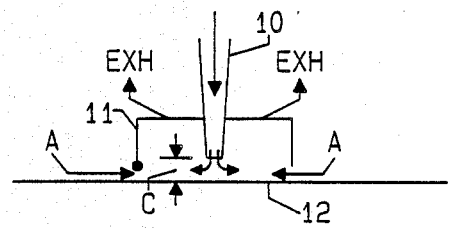
FIG. 1 is a schematic view of a nozzle arranged at a clearance C distance from a perpendicular to a flat glass substrate, shown to illustrate the problems therewith.
Figure 2:
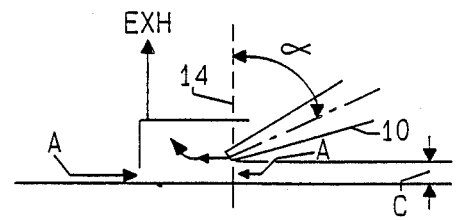
FIG. 2 is a schematic view of a nozzle arranged at a large angle to a normal to a flat glass substrate, shown to illustrate the problem of intermixing of outside air with coating chemical.

In order to fully understand the present invention in all its aspects, the problems associated with prior nozzle coating systems will be illustrated in FIGS. 1 and 2. In FIG. 1 a coating jet nozzle 10 in coating plenum II is directed substantially perpendicular to a substrate surface 12 with a clearance C therebetween. In such nozzle applicator, the carrier gas with vaporized coating chemical therein will exhaust equally in opposite directions over the substrate surface, allowing outside gas A to enter from both sides of the coating zone.

Similarly, as shown schematically in FIG. 2, a coating jet nozzle 10 is oriented at a large angle α with respect to a normal 14 to substrate surface 12. This arrangement allows substantially all of the coating gas to escape from the coating zone in one direction. In such case, considerable outside air A is attracted between nozzle and substrate to mix with and dilute the coating gas.

Figure 3:
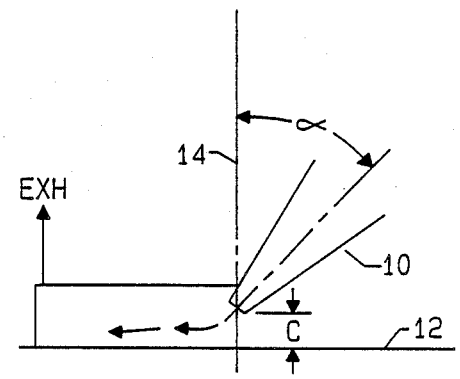
FIG. 3 is a schematic view of a nozzle arranged at a suitable angle to a normal to a flat glass substrate, in which there is substantially zero gas intermixing.

On the other hand, in this invention, it was found, as shown in FIG. 3, that by defining a suitable nozzle angle α at a predetermined jet velocity of gas through the nozzle and a selected clearance C, a substantial reduction of intermixing of outside air will result.

However, in the nozzle arrangement of FIG. 3, where the nozzle is directed to one side of the coating zone only, and an exhaust duct draws spent gases from the same side, of the coating apparatus, the amount of outside gases entering the system becomes solely dependent upon the quantity of exhausted gases, which is very difficult to control.

Figure 4:
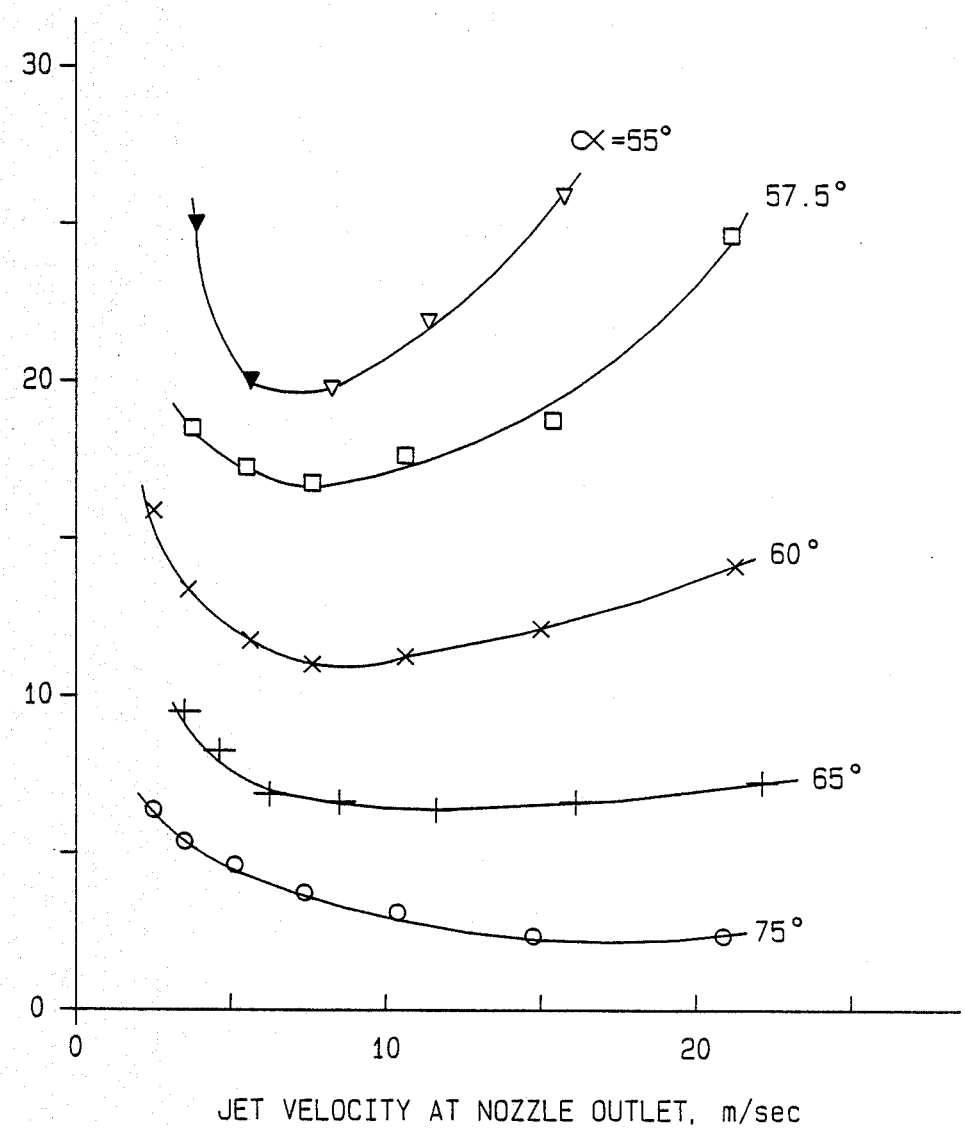
FIG. 4 illustrates operating curves for the nozzle arrangement of FIG. 3, showing the relationship of clearance C and jet velocities at various angles for the condition of substantially zero air intermixing.

Suitable values of nozzle angles α, jet velocity and clearance C for preventing intermixing of coating chemical with outside air are presented graphically in FIG. 4 for the embodiment of a free nozzle illustrated in FIG. 3. Each point on the curves of FIG. 4 represents the condition of substantially no outside gas flowing into the coating zone, or coating chemical and carrier gas escaping to the outside atmosphere. These gas movements were observed by using a small smoke plume originating just outside the coating zone and issuing perpendicular to the substrate. An example, of such suitable values, where there is substantially no intermixing of coating chemical and carrier gas with the outside atmosphere, are a nozzle angle of 60°, a jet velocity of 10 m/sec. and a clearance of 12 mm.

Figure 5:
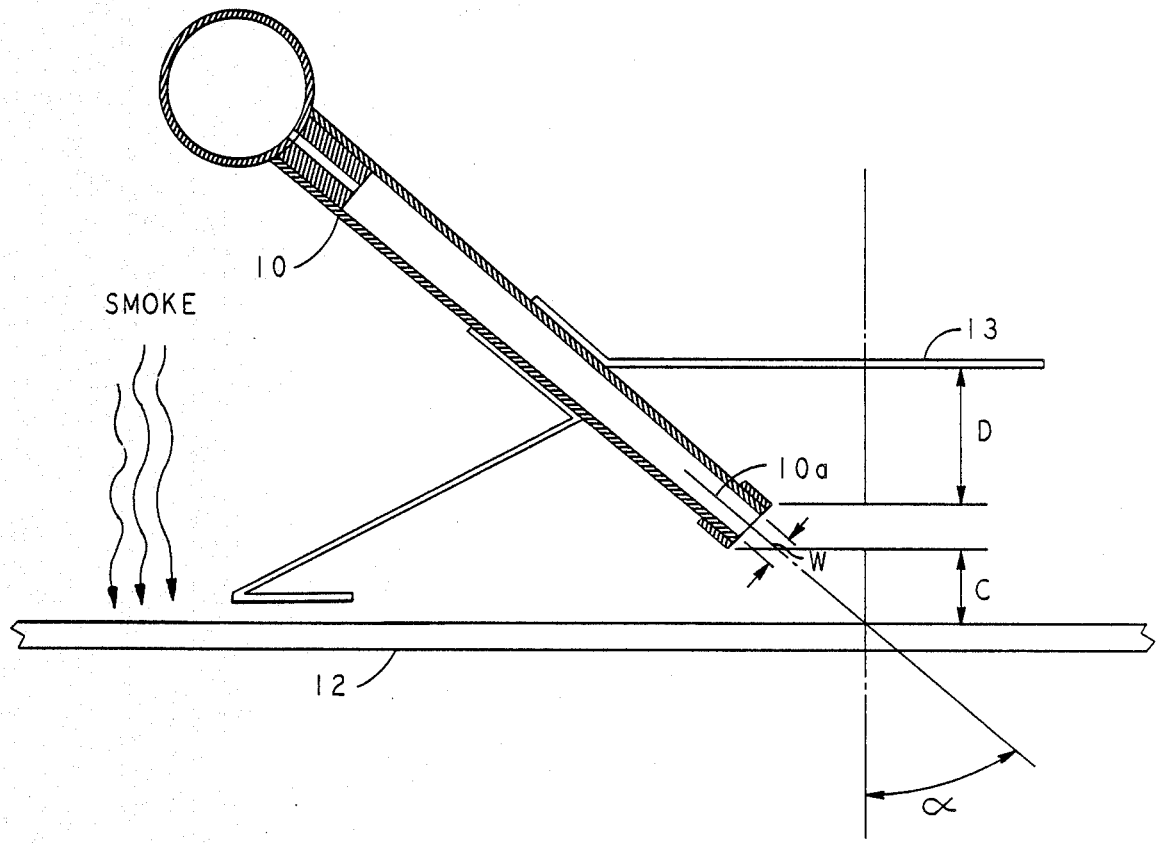
FIG. 5 is a cross-sectional view of a confined coating nozzle provided with a top plate parallel to the surface of the substrate at a height D above the uppermost point of the nozzle opening.

FIG. 5 shows a cross-sectional view of a confined nozzle, which is a nozzle equipped with a top plate 13 positioned at the exit side of nozzle 10 positioned parallel to the surface of the substrate and separated by a distance D above the uppermost point 10a of the nozzle outlet. The presence of top plate 13 is a factor in determining suitable nozzle angles for the condition of zero intermixing of gases. Specifically, with such top plate present as part of the nozzle apparatus, a relatively smaller nozzle angle will provide the same desired condition of zero gas entrainment as a nozzle without such plate element. FIGS. 6 and 7, where D=0 mm, also demonstrate this relationship.

In addition, with D=0, and for such smaller nozzle angles, two clearance values exist for the condition of zero outside air entrainment. The first clearance values, shown in FIG. 6, are in the range of C=0 to 6 mm, while the second clearance values, shown in FIG. 8, are in the range of 10 to 25 mm. Thus, if the clearance distance C is increased from zero, there is a first outward flow of gas from the jet, which becomes zero at the first clearance value, followed by an inward flow of air to the jet, and then to a zero air flow at the second clearance value. However, second zero entrainment values are not present for nozzle angles greater than approximately 45 degrees. Upon further increase in the clearance C distance, the air flow becomes outward for nozzle angles below approximately 40 degrees, and inward for nozzle angles between approximately 40 and 45 degrees.

At a value of D of 12 mm, the nozzle jet of FIG. 5 behaves like the free nozzle system of FIG. 3. This effect is demonstrated in FIG. 8. Accordingly, if the value of D is increased to about five times the nozzle slit width W, the presence of top plate 13 has no appreciable effect on the selected nozzle angles.

Figure 9:
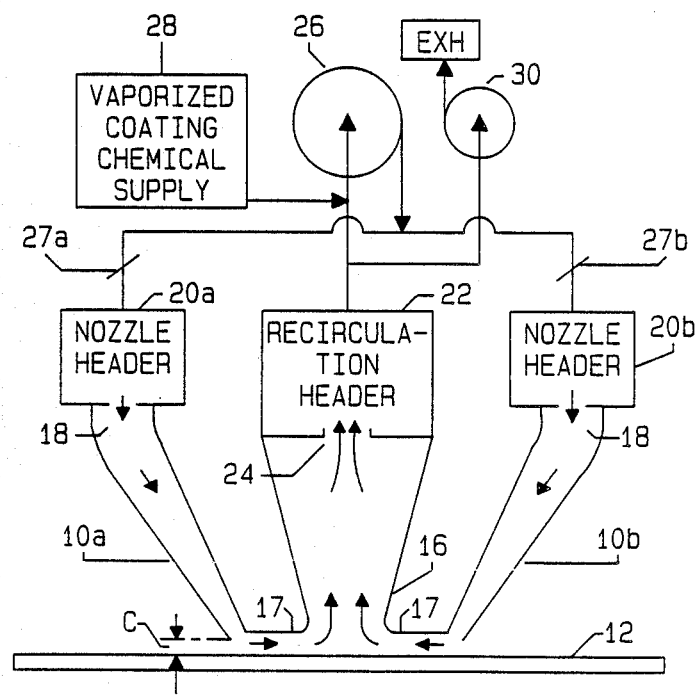
FIG. 9 is a schematic illustration of a coating applicator according to one embodiment of the present invention in which the exhaust is drawn from the recirculation stream.

In view of the above considerations, applicant herein provided the coating applicator shown schematically in FIG. 9. The coating applicator of FIG. 9 includes nozzles 10a and 10b for applying a vaporized coating chemical and carrier gas to substrate 12. The nozzles are arranged in opposing relation to and toward each other, each oriented at an angle of approximately 30 to 70 degrees with respect to a normal to substrate surface 12. Nozzles 10a and 10b are separated from substrate surface 12 by clearance C, which is preferably as small as possible. In particular, the nozzle angles, clearance C and jet velocities are selected, as discussed above, to correspond to a condition of substantially zero gas intermixing. With such an arrangement, dilution of coating gases with outside gas both inside and outside of the coating zone is avoided or minimized.

Figure 12:
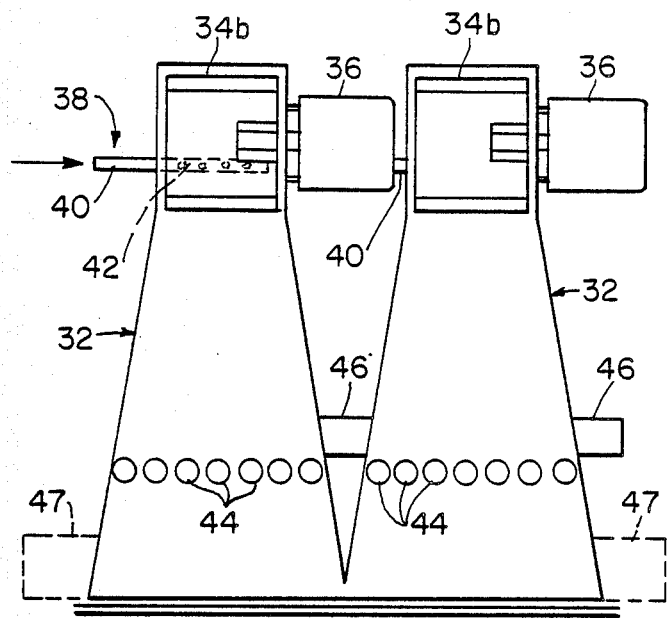
FIG. 12 illustrates the coating applicator of FIG. 11, viewed along line 12—12 thereof.
Figure 13:
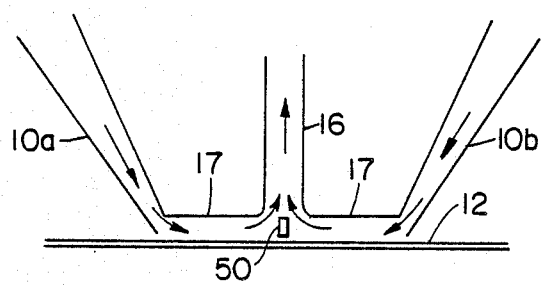
FIG. 13 shows a portion of the coating applicator of the invention in which guide means are provided in the coating zone immediately adjacent the exhaust duct.
Figure 14:
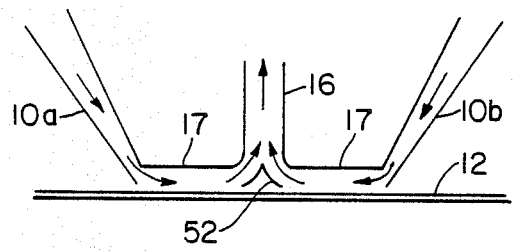
FIG. 14 shows another form of guide means in the apparatus of FIG. 13.
Figure 11:
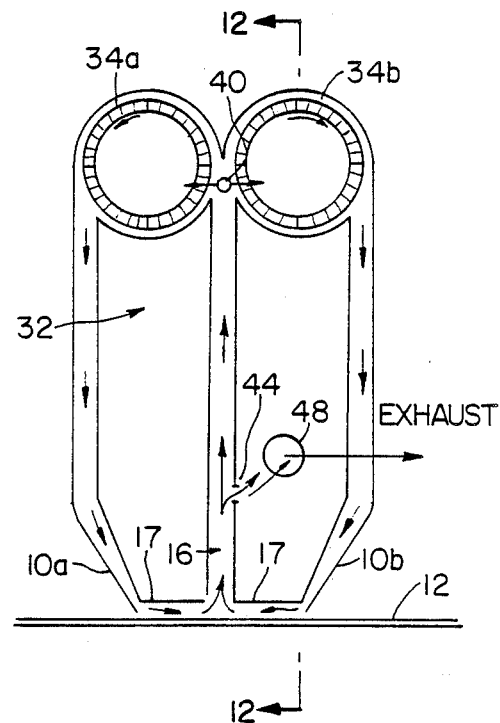
FIG. 11 is a view of a coating applicator consistent with FIG. 9 showing an embodiment of a recirculation blower system.
Figure 16:
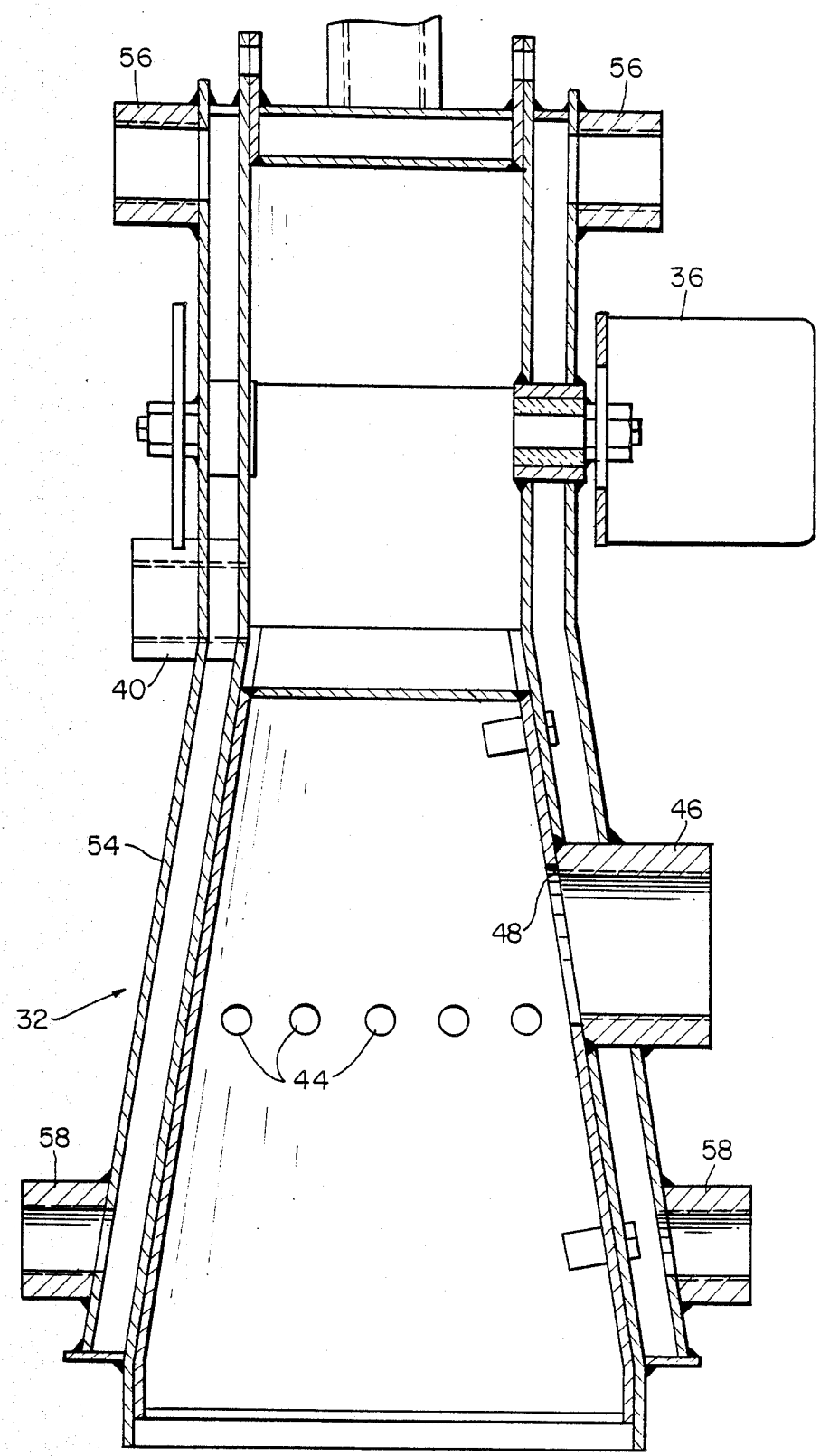
FIG. 16 is another cross-section of the coating applicator of FIG. 15, taken along lines 16—16 thereof, and perpendicular to the direction of travel of the flat glass substrate.

Further, in the coating applicator of FIG. 9, an internal recirculation duct 16 is provided between nozzles 10a and 10b for recirculating coating gases. Valves 27a and 27b in the recirculating lines are positioned upstream of nozzle headers 20a and 20b to allow the opposing jet velocities in the nozzles 10a and 10b to be balanced. Thereby substantially no recirculating gas can escape to the outside atmosphere. In addition, exhaust holes 44, shown in FIGS. 12 and 16, are included to remove the stream of spent coating gases uniformly over the full width of the applicator.

Preferably, each nozzle 10a and 10b will have a length in a direction perpendicular to the glass substrate travel which is substantially equal to the width of the flat glass substrate to be coated. This width may extend up to several meters. In this regard, the circulating coating gas is divided substantially equally over the full length of the nozzles. For example, as shown in FIG. 9, series of holes 18 are equally spaced over the full length of the nozzle headers 20a and 20b in order to supply the vaporized coating chemical to nozzles 10a and 10b, respectively.

In like manner, recirculation duct 16 also extends for a length substantially equal to the width of the flat glass substrate to be coated. Accordingly, a recirculation header 22 is provided having holes 24 equally divided over its full length.

By having relatively low gas velocities in headers 20a, 20b and 22 in comparison with the high gas velocities in holes 18 and 24, the said holes provide an equal distribution of gases. Alternatively, holes 18 and 24 may be replaced by slits or even be eliminated, whereupon headers 20a, 20b and 24, which are provided with equally spaced branches, partly or fully assume its function.

As shown further in FIG. 9, a recirculating blower 26 introduces the vaporized coating chemical and carrier gas to nozzle headers 20a and 20b. In a preferred embodiment, both recirculating blower 26 and exhaust blower 30 are operative, whereby part of the gases are recirculated and another part is exhausted to the atmosphere. With the system of FIG. 9, although only two elongated nozzles 10a and 10b have been provided, it is understood that a plurality of such nozzles may be used on each side. In this case, it is only necessary to incline the outer nozzles at a suitable angle towards each other; the inner nozzles can be set at other angles, including one which is perpendicular to the substrate, although it is preferable that the inner nozzles be suitably angled, too.

Figure 10:
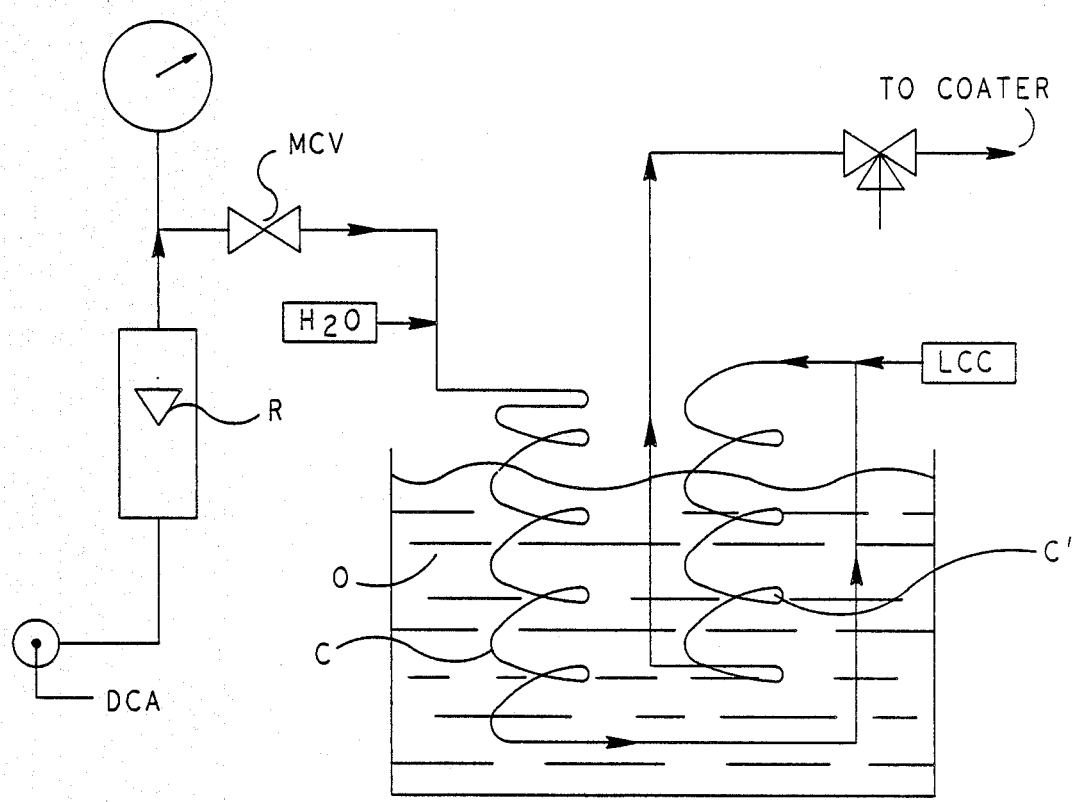
FIG. 10 is a schematic illustration showing the vaporized chemical reactant supply system in more detail.

A detailed illustration of a typical vaporizer system for supplying the vaporized coating chemical 28 in the coating applicator of the present invention is shown in FIG. 10. Accordingly, a source of dry compressed air DCA is metered into the vaporizer using a rotameter R equipped with a manual control valve MCV. A suitable amount of water may be injected into the gas stream if desired using a pump or other means (not shown). The air-water stream then enters a humidification section of the vaporizer, which consists of an downward spiral coil C situated in a circulating hot oil bath 0 maintained at a suitable elevated temperature, e.g. at about 240° C.

The process tubing then returns to the top of the oil bath, at which point the liquid coating chemical LCC is introduced at a predetermined rate by means of another syringe pump. A second downward coil C, within the same circulating hot oil bath, provides sufficient heat and mass transfer to effect vaporization of the coating chemical without decomposition. The desired vapor stream then exits the hot oil bath via an oil traced copper tube and is led to the nozzle headers of the coating applicator, as for example, through the recirculation stream.

The coating chemical reactants which are preferred for chemical vapor deposition onto glass in accordance with the present invention are pyrolyzable organometallic compounds. Organic compounds of metals of Groups I*b* through VII*b* and of Group VIII of the periodic chart may be employed, e.g., betadiketonates, acetylacetonates of metals such as cobalt, iron and chromium may be used. Suitable are organometallic compounds of tin. Many organometallic compounds which exist in solid form at ambient temperature can be vaporized or may be employed in solution for vaporization and CVD.

Some preferred organometallic compounds in accordance with the present invention are liquid at ambient temperature, and may be employed without the use of solvents. For tin oxide coatings, a particularly preferred organometallic compound is monobutyltin trichloride, which is a liquid, characterized by an atmospheric boiling point of 430° F. (221° C.), heat of vaporization of 14.5 kilocalories and entropy of vaporization of 29.4 Clausius per mole.

To form electrically conductive coatings, the organometallic compound may be used in combination with a dopant precursor, which may form part of the compound itself, or be admixed therewith in a coating composition. Particularly useful coating chemical reactants are the liquid coating compositions disclosed in U.S. Pat. No. 4,601,917 to Russo and Lindner.

It is to be realized that the flat glass substrate in FIG. 9 moves relative to nozzles **10*a* and 10*b*. This relative movement can be accomplished by moving the flat glass substrate with respect to stationary nozzles 10*a* and 10*b*, or alternatively, by moving nozzles 10*a* and 10*b*** over a stationary glass substrate. The aforementioned prior art is replete with such means for supporting and moving the substrate, and need not be discussed fully herein.

Referring now to FIGS. 11 and 12, there is shown a modification of the system of FIG. 9, wherein like reference numerals represent like parts, and a detailed description of such like parts will be omitted herein for the sake of brevity. Specifically, a housing 32 is provided which fluidly inter-connects nozzles **10*a* and 10*b* with exhaust duct 16. Recirculation is effected by providing paddle wheels 34*a* and 34*b* which rotate inside housing 32, and operate in a "paddle wheel" mode, to recirculate air from exhaust duct 16 to nozzles 10*a* and 10*b*. Each paddle wheel 34*a* and 34*b* is rotatably driven by a respective motor 36. As shown in FIG. 12**, a plurality of such systems can be linked together to cover a glass substrate having a width larger than can practically be covered with one system.

As with the embodiment of FIG. 9, the paddle wheel system of FIGS. 11 and 12 provides for a supply 38 of coating chemical in a carrier gas. This supply is provided to feed pipe 40 positioned within each housing 32 between and fluidly connected with blower wheels **34*a* and 34*b*. In this regard, each feed pipe 40 includes a plurality of small holes 42** divided over the length thereof in order to divide the coating chemical equally over the length of the coating chamber.

In addition, a series of exhaust holes 44 are provided in fluid communication with exhaust port 48 through one housing 32. Further, side exhaust headers 47, shown in dashed lines in FIG. 12, can be provided at the opposite sides of the applicator, that is, at the widthwise edges of the substrate, for preventing escape of spent gases from opposite sides of the apparatus.

In the systems of FIGS. 9, 11 and 12, it is important that the gas velocity of the coating air issuing from nozzles **10*a* and 10*b* be substantially the same. Otherwise, the higher gas velocity in nozzles 10*a* or 10*b* will allow gases to escape below the outer rim of the opposite nozzle. In order to minimize this, a reactangular guide element 50 extending the length of each housing 32 may be provided centrally below exhaust duct 16, as shown schematically in FIG. 13. A guide 52 having a streamlined configuration is shown in FIG. 14**, which provides enhanced flow characteristics.

In order to minimize the reaction of vaporized coating chemical on the walls of nozzles **10*a* and 10*b* and duct 16, it is preferable to maintain such walls at a constant temperature, of for example, 200° C. by an oil jacket or by alternative means for cooling or heating of the circulating gases. As an example, as shown in FIGS. 15 and 16, which is a drawing of an actual laboratory model of the system of FIGS. 11 and 12, an oil jacket 54 is provided in surrounding relation to said walls, and including oil inlet 58 and oil outlet 56 on the sides of housing 32. The paddle wheels 34*a* and 34*b* are omitted from FIGS. 15 and 16. Preferably, for larger systems, centrifugal blowers can be used, as shown in FIG. 9, but for small systems, the paddle wheels provide a uniform velocity when a slit width of 90 mm is used for the outlets of nozzles 10*a* and 10*b***.

As a feature of the invention, there is substantially no intermixing of coating gases with outside air, and thus very little exhaust power is required to prevent circulating gases from escaping from the system.

FIG. 17 is a schematic view of a modification of the coating applicator system of the invention. In this embodiment, the exhaust is drawn from points external to the nozzles and recirculation lines. FIG. 18 is a cross-sectional drawing of the system of FIG. 17, taken along the direction of glass travel. For sake of brevity, a detailed description of the elements in this modified system which are like those in the embodiment of FIG. 9 will be omitted.

As shown in FIG. 18, nozzle **10*a* and nozzle header 20*a* are secured within housing 60*a*, the upper end of which is pivotally secured by pivot pin 62*a* to frame 64*a*. In like manner, nozzle 10*b* and nozzle header 20*b*** are secured within a housing 60b, the upper end of which is pivotally secured by pivot pin 62b to frame 64b.

In addition, nozzle header 20a is provided with an extension 66a in fluid communication therewith and extending axially away from nozzle 10a. A supply pipe 68a is secured in fluid communication with extension 66a. Supply pipe 68a, in turn, is pivotally secured to a screw-threaded rod 70a, positioned through hole 72a, which allows adjustment of the angle between the nozzle 10a and the surface of the substrate. In like manner, nozzle header 20b can be adjusted (not shown).

The screw-threaded rods 78a and 78b are secured to frames 64a and 64b and extend through slotted apertures 80a and 80b in main frame 82 of the apparatus. Rods 78a and 78b can be adjusted in height independently within apertures 80a and 80b to change the distance of clearance D between respective outlet and top plate 17. Further, means exist (not shown) for adjusting the clearance C between the nozzles and the glass substrate 12. The angle between the normal to the substrate and the nozzle is chosen at approximately 35 degrees, at clearance values C corresponding to the first zero entrainment point.

As shown, recirculation header 22, top plate 17 and duct 16 are carried by housing 86, which has an extension 88 in fluid communication therewith, the latter being secured to main frame 82 for vertical movement with nozzles 10a and 10b.

In accordance with this embodiment of the invention, external exhaust nozzles 90a and 90b are mounted with coating nozzles 10a and 10b, respectively, below the latter, so that the nozzle outlets of exhausts 90a and 90b are positioned with the same clearance C above substrate 12 and external to the nozzle outlets of coating nozzles 10a and 10b. External exhaust headers 92a and 92b are fluidly connected to an exhaust blower (not shown) which removes the spent coating material to the atmosphere. If desired, conventional pollution control equipment, not shown, may be employed to treat the effluent before it enters the atmosphere. On the other hand, recirculation header 22 is fluidly connected to the recirculation blower (not shown) and may be used also to exhaust part of the recirculating gases.

Figure 17:
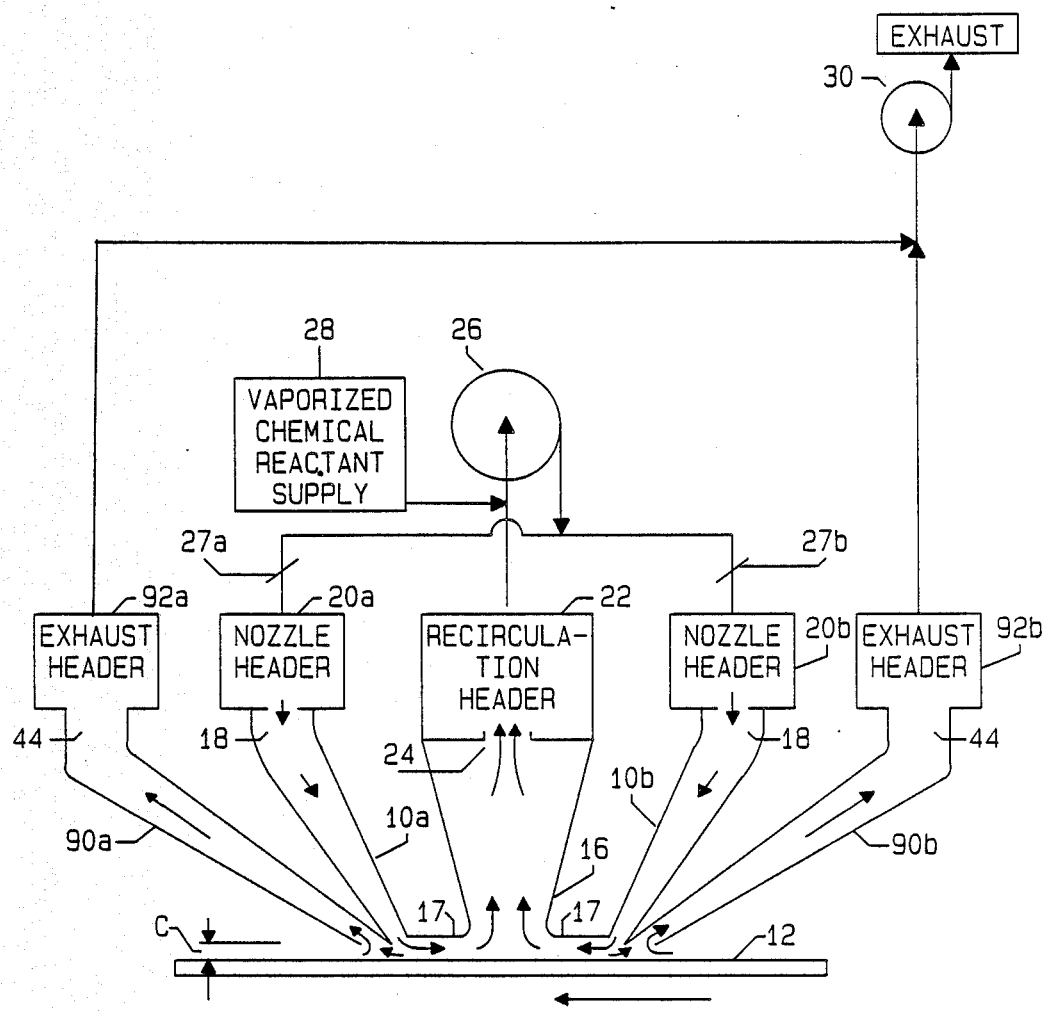
FIG. 17 is a schematic illustration of a coating applicator according to another embodiment of the invention in which the exhaust is drawn from points external to the nozzles and recirculation system.
Figure 18:
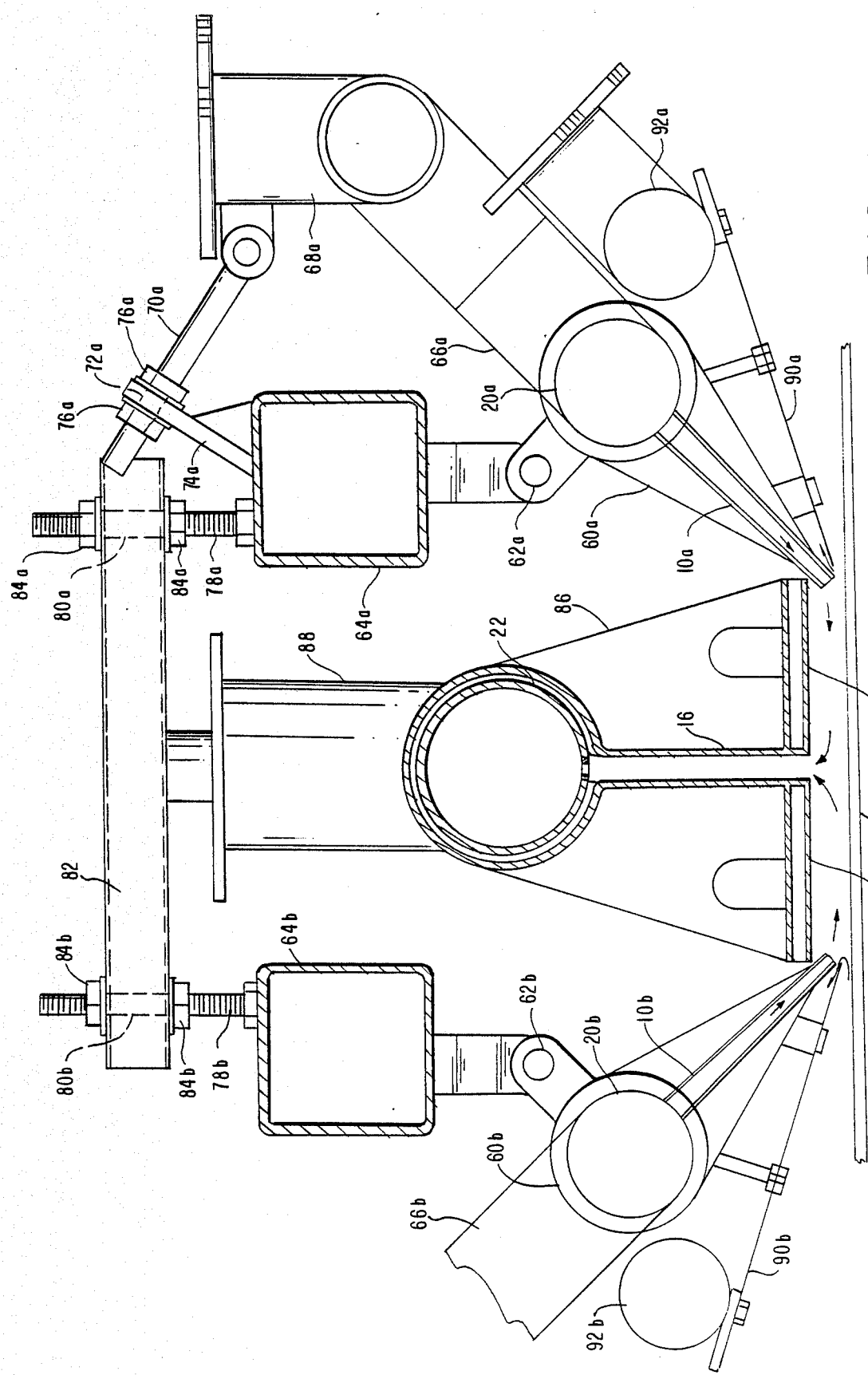
FIG. 18 is a cross-sectional drawing of a coating applicator consistent with FIG. 17 taken along the direction of travel of the flat glass substrate.
Figure 19:
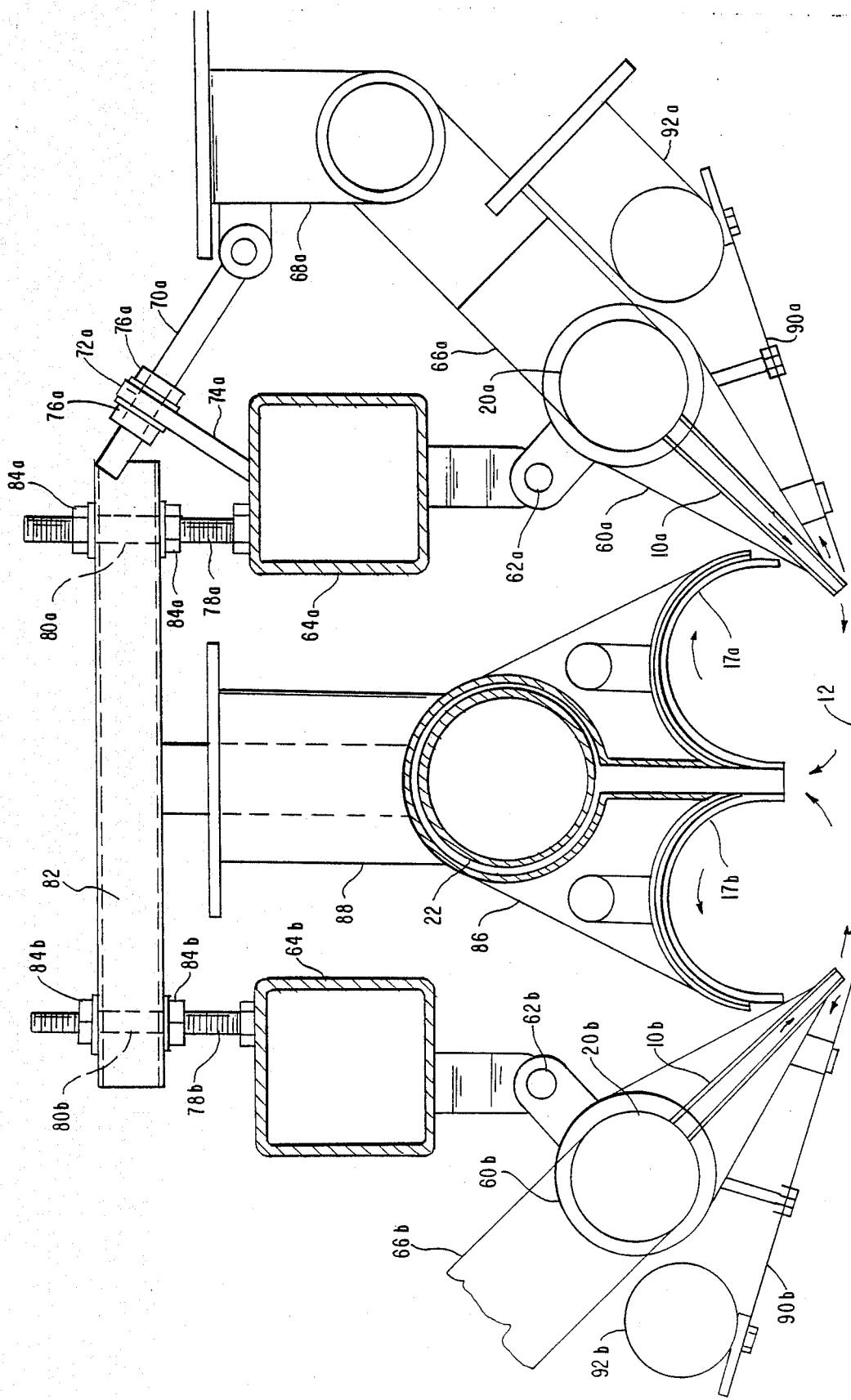
FIG. 19 is a cross-sectional view of another embodiment of the coating applicator of FIG. 18.

Referring now to FIG. 19, there is shown a modification of the system of FIGS. 17 and 18, wherein like elements represent like parts, and a detailed description of such like parts are omitted. As shown in FIG. 19, top plates 17 of FIG. 17 are replaced by hollow, cylindrical plates 17'. With this arrangement, gases will circulate within the cylindrical chamber, as indicated by the arrows therein. As a result of such recirculation, the velocity of the coating gas is maintained high and constant over the full length of the applicator. Because the coating jets behave like jets without a top plate, the optimum angle of nozzles 10a and 10b preferably is within the range of 50 to 70 degrees, as opposed to a preferred angle in the range of 30 to 50 degrees for the embodiment of FIG. 17.

In the embodiments of FIGS. 17, 18 and 19, external exhaust nozzles 90a and 90b may be used, instead, to admit a barrier gas, which is exhausted from recirculating pipe 88. Alternatively, although not shown, a barrier gas can be admitted between coating nozzles 10a and 10b and exhaust nozzles 90a and 90b.

Films prepared according to the preferred embodiments of the invention have infrared reflectivities greater than 70% at the conventional 10 micron wavelength of light which is characteristic of thermal infrared radiation at room temperature, a visible transmittance of 80% or greater, a sheet resistance of less than 40 ohm/sq., and conductivities greater than 1250 (ohm cm)$^{-1}$ for films 160–250 nm thick. These films show a uniform iridescence in reflected light which indicates a uniform film, and are substantially haze-free. Deposition is carried out at a rate of about 1000 Å per second or greater; thereby the desired film thickness of 2000 Å is obtained within 2 seconds or less.

In general, to increase the deposition rate, the substrate is maintained at a temperature as high as possible. For tin oxide films, this deposition temperature is about 550° to 750° C., and preferably about 600° to 700° C. The maximum jet velocity is determined by practical considerations, such as its effect on cooling of the substrate and the desired balance of the coating nozzles. Similarly, the maximum coating concentration in the system is limited by the vapor pressures and decomposition temperatures of the coating chemicals used and by the amount of other reactants such as water and oxygen needed for reaction with the coating chemical.

As described, prevention of intermixing of coating gases with the outside atmosphere in this invention is important for several reasons. If the outside air is allowed to enter the coating zone, there is an immediate dilution of the concentration of the coating chemical within the coating zone, which upsets the reaction rate controlled conditions. Similarly, leakage of coating chemical into the outside atmosphere provides coating chemical at a very low concentration and at a low velocity at substrate sites outside of the coating zone, and this results in deposition of films under diffusion rate control which are very hazy.

The slit width in this invention should be large enough to prevent clogging but small enough to maintain the desired high jet velocities. A suitable slit width is about 5 mm.

The coating applicator of the invention may be used to apply coating films on the bottom or top surfaces of a flat glass substrate, either from above or below the substrate, preferably while it is moving. The apparatus can be used also for off-line coating using reheated glass.

EXAMPLE 1

Figure 15:
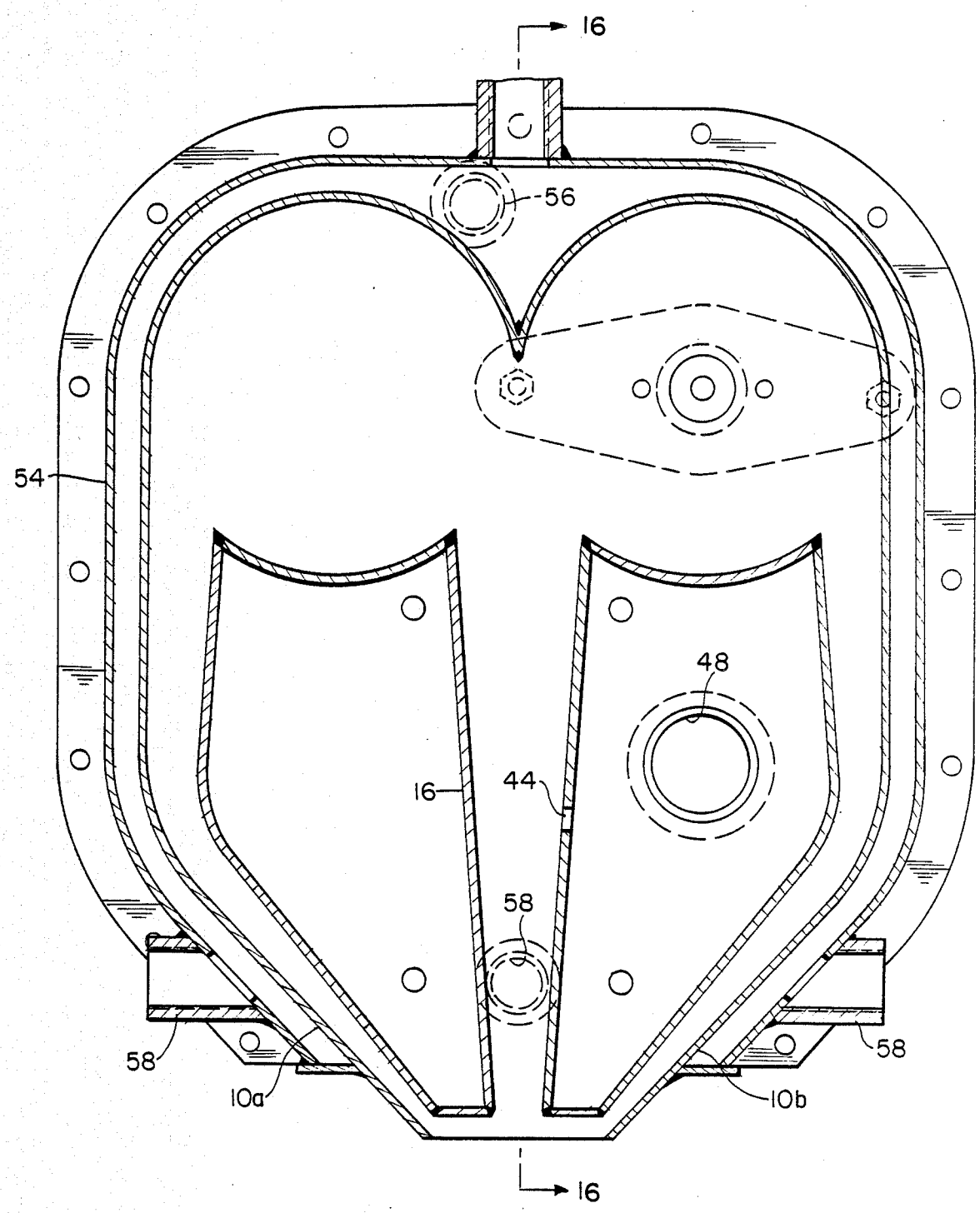
FIG. 15 is a drawing of a coating applicator consistent with the schematic of FIG. 9 shown in cross-section parallel to the direction of travel of the flat glass substrate.

A balanced coating applicator according to FIGS. 15 and 16 is equipped with the external exhaust of FIG. 18. The applicator has a coating zone of 44 mm. in length parallel to the direction of glass travel, and is 90 mm. in width. The two opposing nozzles of the applicator are directed towards each other at angles of 45° to a normal to the substrate. The slit width is 3.5 mm. The external exhausts have slots which are 4 mm. in width and are positioned immediately external to and adjacent the coating nozzles. The substrate is 1.5 mm. thick soda-lime float glass having its float side resting on a heating table maintained at 650° C. During coating, the heating table and substrate are moved past the applicator nozzles at a constant speed of 3.14 cm./sec. The clearance between substrate and nozzle is maintained at approximately 2 mm.

In the vaporizer apparatus of FIG. 10, 9.7 ml/hr. of distilled water is injected into a 2.09 standard liter/min. air stream. This stream enters the first coil of the vaporizer, which is immersed in an oil bath maintained at 240° C., where the water is vaporized and the stream is preheated. Then 106 ml/hr of a liquid coating chemical composition, as described in aforementioned U.S. Pat. No. 4,601,917 is injected into the preheated air/water stream and vaporized in the second coil of the vaporizer. This vapor stream then is admitted into the recirculation duct of the coater.

The recirculation rate of the coater is set so that a jet velocity of 5 m/sec. is measured at the exits of each of the nozzles. The external exhaust rate is set to approximately ⅔ of the volumetric recirculation rate. The measured temperature of the circulating gas stream is approximately 180° C.

After depositing for a period of 1.4 sec., a doped tin oxide film is formed on the surface of the glass. This film has a thickness of 1850 A, corresponding to a deposition rate of 1320 A/sec. The electrical resistance of the film is 37 ohms/square, and it is uniform, transparent and substantially haze-free.

With these considerations in mind, and with the understanding that various changes and modifications can be effected therein by one skilled in the art, the foregoing example represents a practical embodiment of the present invention.

It will be particularly apparent to one of skill in art that in addition to the flat glass described herein as preferred substrate for deposition, many other substrates may be employed as work pieces for coating in the present inventive apparatus and process.

What is claimed is:

1. Apparatus for depositing a film on a surface of a substrate maintained at a deposition temperature comprising:
   a pair of opposing coating nozzle means directed toward each other for applying a vaporized coating chemical in a carrier gas to said surface at such a concentration and vapor velocity that deposition of said film is carried out under substantially reaction-rate-controlled conditions, said nozzle means having angle-adjustment means,
   each of said nozzle means being positioned adjacent said surface of said substrate with a clearance therebetween which is open to the outside atmosphere and at an angle of from about 30 to about 70 degrees with respect to a normal to said surface such that there is substantially no intermixing of chemical vapors with said outside atmosphere,
   supply means for said vaporized coating chemical and carrier gas to said nozzles, and
   exhaust means for removing exhaust material.

2. Apparatus according to claim 1 further including recirculation means for recirculating vaporized coating chemical and carrier gas.

3. Apparatus according to claim 1 wherein said substrate is flat glass.

4. Apparatus according to claim 1 wherein there is relative movement between said substrate and said nozzle means.

5. Apparatus according to claim 1 wherein the velocity of vapor exiting each said nozzle is substantially the same as the velocity existing the other.

6. Apparatus according to claim 1 further including jacket means surrounding said coating nozzle means and recirculation means for receiving a circulating fluid to maintain the walls of said means at a desired temperature.

7. Apparatus according to claim 1 wherein said selected angle is substantially the same for each of said nozzles.

8. Apparatus according to claim 2 wherein said recirculation means includes at least one recirculation blower with control means to feed said vapors to said nozzles at substantially the same velocity.

9. Apparatus according to claim 2 wherein said recirculation means includes a duct which is positioned between said pair of opposing nozzles for recirculating gases therefrom.

10. Apparatus according to claim 2 wherein said exhaust means includes an exhaust blower fluidly connected to said recirculation blower for removing exhaust gases from the circulating gas stream.

11. Apparatus according to claim 2 wherein said exhaust means includes exterior exhaust means positioned exteriorly of and adjacent to said pair of opposing nozzles for removing exhaust material.

12. Apparatus according to claim 11 wherein said exterior exhaust means further includes a pair of exhaust slots positioned adjacent to said surface of said substrate with said clearance therebetween.

13. Apparatus according to claim 2 wherein said supply means includes header means for supplying said coating chemical and carrier gas under pressure from said recirculation blower means to said nozzle means, said header means including a plurality of holes spaced along the length of said header meaner for evenly distributing said coating chemical to nozzle means.

14. Apparatus according to claim 1 further including height adjustment means for adjusting the clearance of each of said nozzles from said surface of said substrate.

15. Apparatus according to claim 1 wherein said substrate has a width, and wherein each nozzle means extends for a length substantially equal to the width of said substrate.

16. Apparatus according to claim 1 wherein said angle adjustment means includes pivot means for pivotally mounting each said coating nozzle to a frame of said apparatus, and adjusting means for pivotally moving each said coating nozzle about said pivot means to change the angle of the respective coating nozzle with respect to a normal to said surface of said substrate.

17. Apparatus according to claim 1 further including guide means positioned between said opposing coating nozzles and above said surface of said substrate.

18. Apparatus according to claim 2 further including plate means positioned between each said coating nozzle and said recirculation means above said surface of said substrate.

19. Apparatus according to claim 18 wherein said plate means is a substantially flat plate, and is arranged substantially parallel to said surface.

20. Apparatus according to claim 18 wherein said plate means has a hollow, semi-cylindrical configuration.

21. Apparatus according to claim 2 further including replenishing means for furnishing additional coating chemical to said coating nozzle means.

* * * * *